(12) United States Patent
Hwu et al.

(10) Patent No.: US 6,352,939 B1
(45) Date of Patent: Mar. 5, 2002

(54) METHOD FOR IMPROVING THE ELECTRICAL PROPERTIES OF A GATE OXIDE

(75) Inventors: Jenn-Gwo Hwu, Taipei; Yen-Hao Shih, Changhua, both of (TW)

(73) Assignee: National Science Council, Taipei (TW)

(*) Notice: Subject to any disclaimer, the term of this patent is extended or adjusted under 35 U.S.C. 154(b) by 0 days.

(21) Appl. No.: 09/506,850

(22) Filed: Feb. 17, 2000

(30) Foreign Application Priority Data

Jun. 10, 1999 (TW) .................................. 88109723 A

(51) Int. Cl.[7] ..................... H01L 21/302; H01L 21/461
(52) U.S. Cl. ..................... 438/754; 438/756; 438/757; 438/585; 205/173
(58) Field of Search .................... 438/585, 591, 438/594, 790, 745, 747, 754, 756, 757, 759, 770, 782; 205/173, 199, 200, 223, 264; 204/468

(56) References Cited

U.S. PATENT DOCUMENTS

| | | | | |
|---|---|---|---|---|
| 4,289,602 A | * | 9/1981 | Sansregret | 204/32 |
| 5,435,896 A | * | 7/1995 | Hardee et al. | 204/247 |
| 5,616,233 A | * | 4/1997 | Jenn-Gwo et al. | 205/157 |
| 5,736,454 A | * | 4/1998 | Hwu et al. | 438/585 |
| 6,100,562 A | * | 8/2000 | Yamazaki et al. | 257/347 |
| 6,143,627 A | * | 11/2000 | Robinson | 438/441 |

* cited by examiner

Primary Examiner—Matthew Smith
Assistant Examiner—Calvin Lee
(74) Attorney, Agent, or Firm—Knobbe Martens Olson & Bear LLP

(57) ABSTRACT

A method for improving the electrical properties of a gate oxide is disclosed. The method includes the steps of providing a silicon wafer with a gate oxide formed thereon, providing a platinum plate, immersing the silicon wafer and the platinum plate in a chemical solution with a relatively high electrical conductivity, respectively connecting the silicon wafer and the platinum plate to the negative terminal and the positive terminal of a current source, inducing an electron current to flow from the negative terminal of the current source through the silicon wafer to the platinum plate, removing the silicon wafer from the chemical solution and removing the residual chemical solution from the surface of the gate oxide, and treating the gate oxide with an annealing process.

21 Claims, 5 Drawing Sheets

METHOD FOR IMPROVING THE ELECTRICAL PROPERTIES OF A GATE OXIDE

FIELD OF THE INVENTION

The present invention relates to a gate oxide, and more particularly to a method for improving the electrical properties of a gate oxide.

BACKGROUND OF THE INVENTION

As a result of the mushroom growth of microcircuit technology, the dimension of the semiconductor element is getting small. Nowadays, in order to develop the sub-micron technology applied in the field of ULSI (ultra-large-scale integration) circuit, the thickness of gate oxide is dropped below 100 Å A as well. In a wide variety of the approaches for growing the gate oxide, the thermal oxidation process is widely used. The trend of developing the thermal oxidation process is focused on how to manufacture a thin and high-quality gate oxide in concord with the requirement of the gate oxide in a ULSI circuit. Thus, the gate oxide must own the characteristics of high dielectric constant, low oxide charge, high breakdown voltage, and so forth.

The conventional approach for growing an oxide layer is carried out in a heating tube. However, the conventional approach for growing a gate oxide is gradually replaced by rapid thermal oxidation (RTO). Currently, the two-step rapid thermal oxidation (RTO) followed by rapid thermal annealing (RTA) has been used for making thin and high-quality oxides. Generally, there are two approaches applied in the growth of the gate oxide: (1) performing thermal oxidation in the presence of a pure and dry oxygen, followed by rapid thermal annealing in the presence of nitrogen, and (2) performing thermal oxidation under the atmosphere of nitrous oxide, followed by rapid thermal annealing in the presence of nitrogen. Though the gate oxide grown by the above approach has a dense structure and can suffer a high breakdown electric field and can score higher charge-to-breakdown, its thickness is not uniform. It will cause the unstable gate oxide in the subsequent fabrication process.

SUMMARY OF THE INVENTION

Therefore, an object of the present invention is to provide a method for improving the breakdown electric field strength and increasing the charge-to-breakdown of the gate oxide.

Another object of the present invention is to form the gate oxide with uniform thickness.

According to the present invention, the gate oxide is formed by the following steps: (a) providing a silicon wafer with a gate oxide formed thereon, (b) providing a specific metal plate, (c) immersing the silicon wafer and the specific metal plate in a chemical solution, (d) respectively connecting the silicon wafer and the specific metal plate with a current source and inducing an electron current to flow from the current source through the gate oxide of the silicon wafer to the specific metal plate, (e) removing the silicon wafer from the chemical solution and removing the residual chemical solution from the surface of the gate oxide, and (f) treating the gate oxide with an annealing process.

Certainly, before the gate oxide is grown on the surface of the silicon wafer, it is necessary to clean the surface of the silicon wafer by the RCA (Radio Corporation of America) clean process.

Preferably, the gate oxide is formed by a thermal oxidation process, such as a rapid thermal oxidation (RTO) process. Preferably, the gate oxide can be made of silicon oxide ($SiO_2$), silicon nitride ($Si_3N_4$), or tantalum oxide ($Ta_2O_5$).

Preferably, the specific metal plate is a platinum plate. The platinum plate is electrically connected to the positive terminal of the current source to serve as an anode, and the silicon wafer is electrically connected to the negative terminal of said current source to serve as a cathode.

Certainly, the chemical solution has a relatively high electrical conductivity.

Preferably, the chemical solution is a diluted hydrofluoric acid (HF) solution having a concentration ranged from 0.049% to 0.98%, and more preferably 0.245%.

Preferably, the electron current has a current density ranged from $0.1 \mu A/cm^2$ to $10 \mu A/cm^2$, and more preferably $4 \mu A/cm^2$.

Certainly, the step of removing the residual chemical solution from the surface of the gate oxide is carried out by cleaning the surface of said gate oxide by the deionized water.

Certainly, the annealing process is a rapid thermal annealing (RTA) process.

Now the foregoing and other features and advantages of the present invention will be more clearly understood through the following descriptions with reference to the accompanying drawings, in which:

DETAILED DESCRIPTION OF THE PREFERRED EMBODIMENTS

The present invention will now be described more minutely with reference to the following embodiment. It is to be noted that the following descriptions of preferred embodiment of this invention are presented herein for the purpose of illustration and description only. It is not intended to be exhaustive or not to be restricted to the precise form disclosed.

Figure 1B:
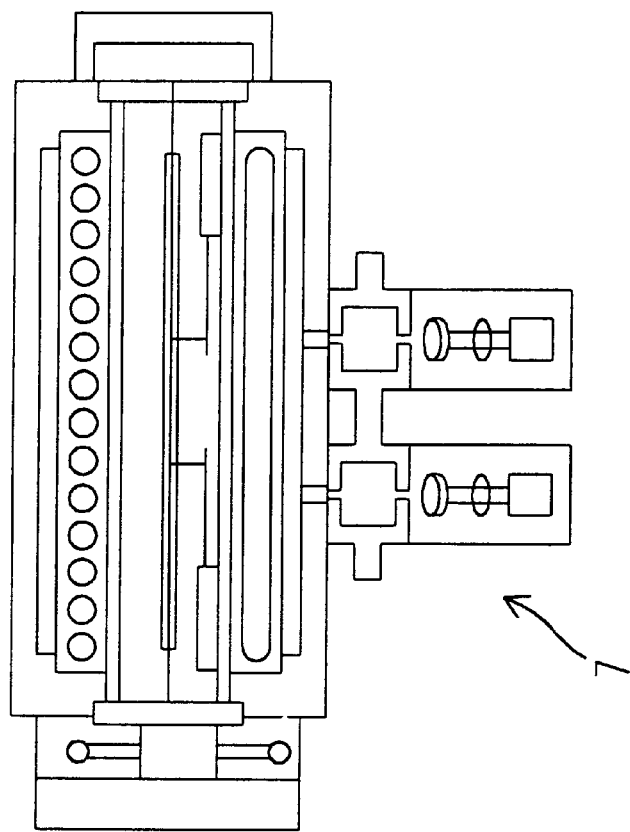
FIG. 1*b* is a schematic diagram showing the rapid thermal processing (RTP) chamber.
Figure 1A:
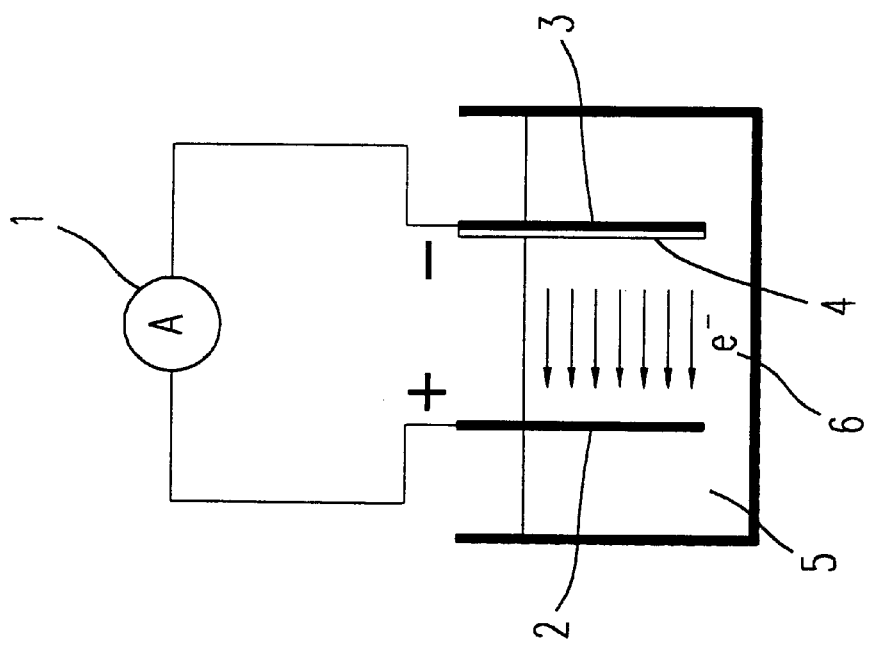
FIG. 1*a* is a schematic diagram showing the necessary equipment for forming a gate oxide according to the present invention.

Please refer to FIG. 1*a* which is a simplified diagram showing the necessary equipment for forming a gate oxide according to the present invention. First, after performing the RCA (Radio Corporation of America) clean process to clean the surface of the silicon wafer 3, the silicon wafer 3 is put into a rapid thermal processing (RTP) chamber 7 as shown in FIG. 1*b* and a gate oxide 4 is grown on the surface of the silicon wafer 3 by rapid thermal oxidation (RTO).

Then, the silicon wafer 3 and a platinum plate 2 are immersed in a diluted hydrofluoric acid solution 5 having a concentration of 0.245%. The diluted hydrofluoric acid solution 5 has a relatively high electrical conductivity and is adapted to be an excellent solution for conducting electrons.

Furthermore, the silicon wafer 3 and the platinum plate 2 are connected to the negative terminal and the positive terminal of a current source 1 respectively (the Kethley 220 current source is adopted to be the current source in this preferred embodiment). The silicon wafer 3 serves as a cathode and the platinum plate 2 serves as an anode.

The diluted hydrofluoric acid solution 5 will begin to etch the gate oxide 4 when the Kethley 220 current source 1 is turned on. A strong electron current 6 will flow from the negative terminal of the Kethley 220 current source 1 through the silicon wafer 3 to reach the platinum plate 2. Therefore, the electron current 6 will penetrate through the gate oxide 4 and stress the gate oxide. Because the thickness of the region with worse quality on the gate oxide 4 is thinner than that with better quality on the gate oxide 4, more electrons will be accumulated in the boundary of the silicon wafer 3 and the gate oxide 4 but less hydrofluoric acid ions will be accumulated in this boundary. Thus, the etching rate will be lowered and the gate oxide formed thereby will be more uniform. Hence, more electrons will penetrate through the gate oxide 4 and ruin the regions having unsaturated or incomplete bonds on the gate oxide 4.

After the above-described regions are ruined thoroughly, the silicon wafer 3 is placed into a rapid thermal processing (RTP) chamber 7 as shown in FIG. 1b for performing rapid thermal annealing (RTA). The rapid thermal annealing process will rebind the regions which have been ruined by the electrons. After the gate oxide 4 is grown on the surface of the silicon wafer 3, many regions on the gate oxide have incomplete bonds. Such regions will easily generate the so-called electron traps under the high electric field. Thus, the RTA can improve the regions having incomplete bonds so that the stability of the gate oxide 4 is raised.

Furthermore, in order to further understand this preferred embodiment of the present invention, four specimens formed by different methods are established for illustration. The specimen 1 is formed by rapid thermal oxidation (RTO) plus post annealing (POA). The specimen 2 is formed by rapid thermal oxidation (RTO) plus CAESA (chemical assisted electron stressing annealing), except that the deionized water ($H_2O$) is substituted for the diluted hydrofluoric acid solution. The specimen 3 is formed by rapid thermal oxidation (RTO) plus CAES (chemical assisted electron stressing), except that the annealing process is eliminated. The specimen 4 is formed by rapid thermal oxidation (RTO) plus CAESA (chemical assisted electron stressing annealing).

Figure 2:
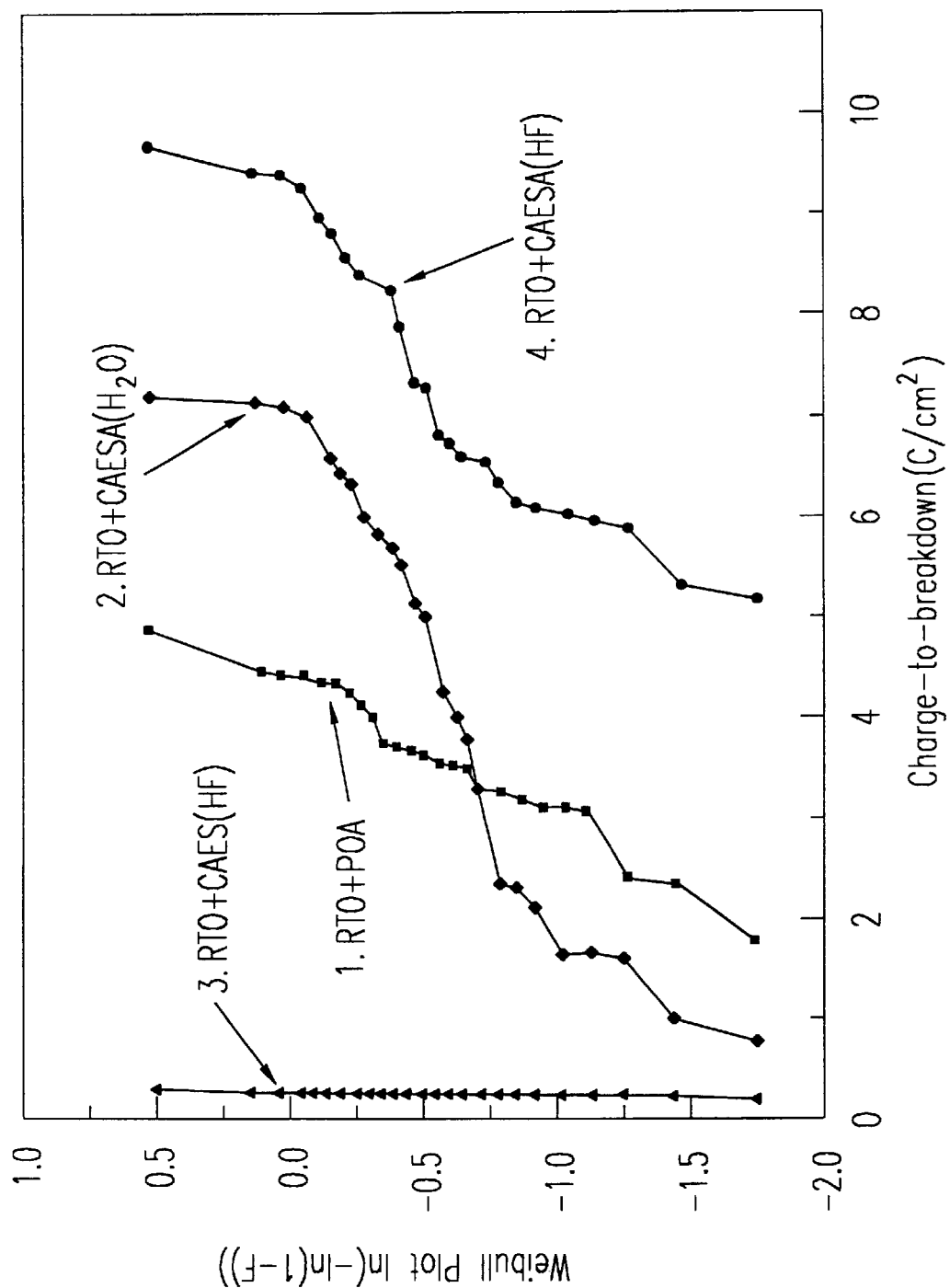
FIG. 2 is a weibull plot of the four gate oxide specimens under the time-dependent dielectric breakdown constant current stressing test, wherein the current density is 20 $mA/cm^2$.

Please refer to FIG. 2 which is the weibull plot of the four above-described specimens under the time-dependent dielectric breakdown constant current stressing test, wherein the vertical axis stands for the natural logarithm value of the negative natural logarithm value (1−F) and the horizontal axis stands for the charge-to-breakdown. The F here denotes the factor of the point along the curve. It is obvious that the quantity of charge-to-breakdown of the specimen 4 is at least two times greater than that of the specimen 1 when the gate oxide reaches the breakdown point. Furthermore, the deionized water ($H_2O$) is adopted to conduct electrons in the specimen 2, but the electrical conductivity of the deionized water is less than that of the diluted hydrofluoric acid solution. Therefore, the electrons can not selectively penetrate through the region with worse quality on the gate oxide and the path for the electrons to penetrate through the gate oxide is affected so that the curve of the specimen 2 spreads widely.

Figure 3:
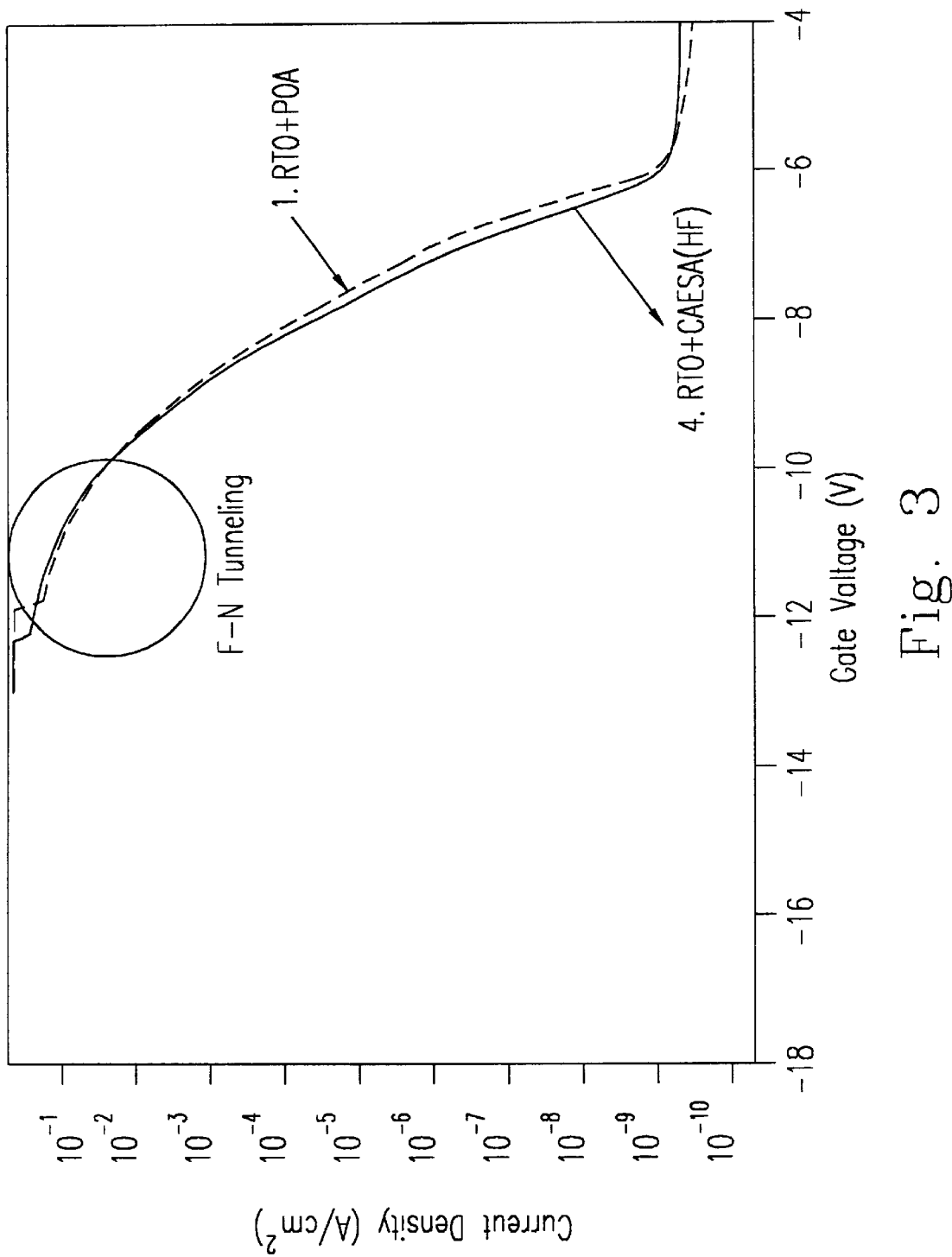
FIG. 3 is a plot showing the current density—gate voltage characteristic of the specimen 1 and the specimen 4 of FIG. 2.

Please refer to FIG. 3 which is the a typical current density-gate voltage characteristic plot of the specimen 1 and the specimen 4, wherein the vertical axis stands for current density J and the horizontal axis stands for gate voltage V. it is worthy to note that the occurrence time of the F-N tunneling of the specimen 1 is earlier than that of the specimen 4. However, the current density of the specimen 1 is smaller than that of the specimen 4 before the two specimens reach the breakdown point. It indicates that more electron traps will be generated when the specimen 1 reaches breakdown under a high electric field. Therefore, the electrons are unable to penetrate through the gate oxide because of the repulsion of the negative charge so that the current density of the specimen 1 is smaller than that of the specimen 4. The concentration of electron traps is higher in the high electric field so that more electrons are allowed to penetrate through the gate oxide in the time-dependent dielectric breakdown constant current stressing test. It also proves that the specimen 4 is more stable.

Figure 4:
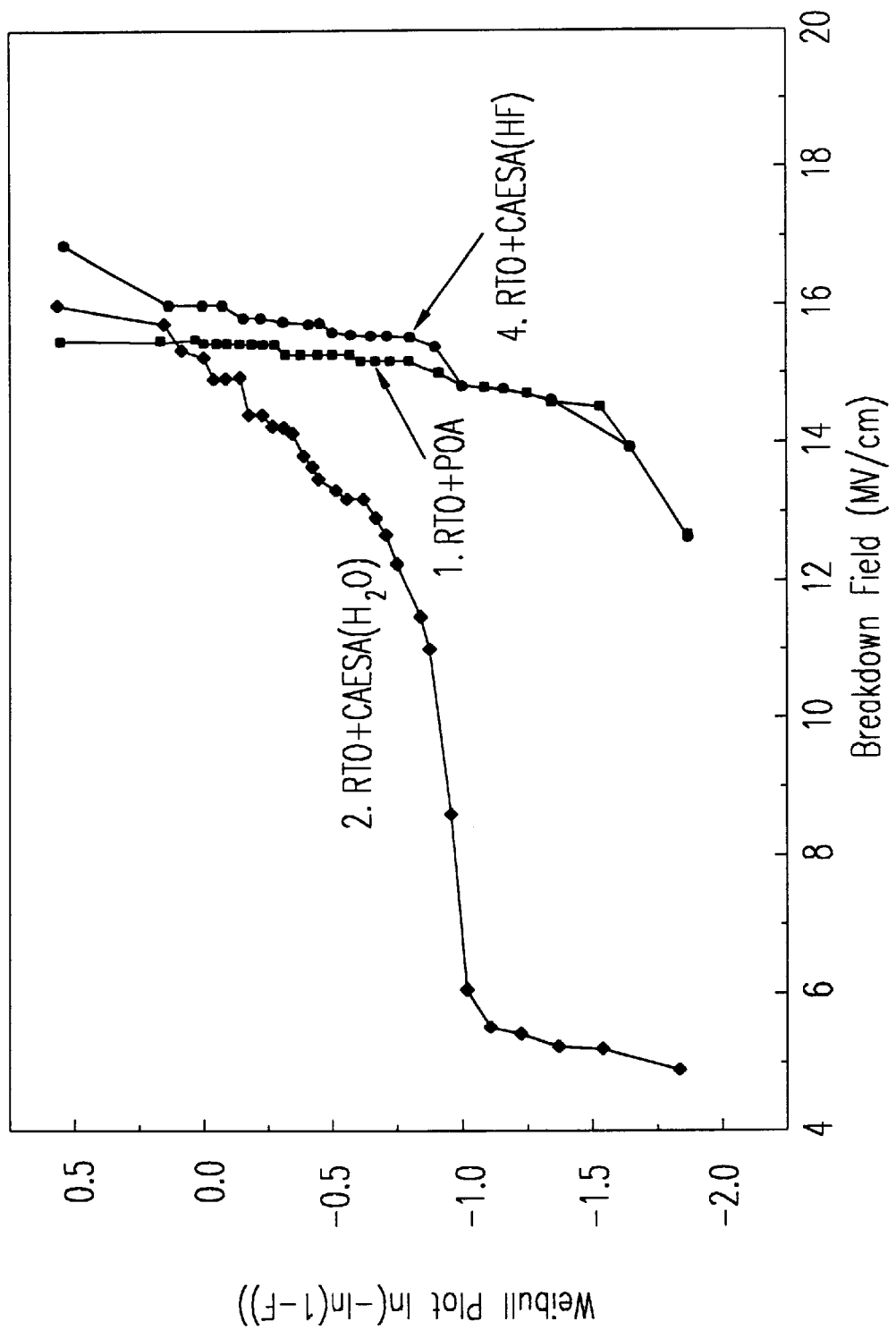
FIG. 4 is a weibull plot of the specimen 1, the specimen 2, and the specimen 4 of FIG. 2 under the time-zero dielectric breakdown stressing test.

Please refer to FIG. 4 which is the weibull plot of the specimen, the specimen 2, and the specimen 4 of FIG. 2 under the time-zero dielectric breakdown stressing test, wherein the vertical axis stands for the natural logarithm value of the negative natural logarithm value (1−F) and the horizontal axis stands for the breakdown electric field. Also, the F here denotes the factor of the point along the curve. It can be seen from FIG. 4 that the specimen 4 has a higher breakdown electric field and the curve of specimen 2 spreads widely. It indicates that if the deionized water employed to form the gate oxide of the specimen 2 can not allow the electrons to penetrate through the regions with worse quality on the gate oxide, the regions with better quality on the gate oxide will be ruined too. Besides, the RTA process is unable to rebind the regions that have been ruined by electrons thoroughly, and thus the curve of the specimen 2 spreads widely.

Figure 5:
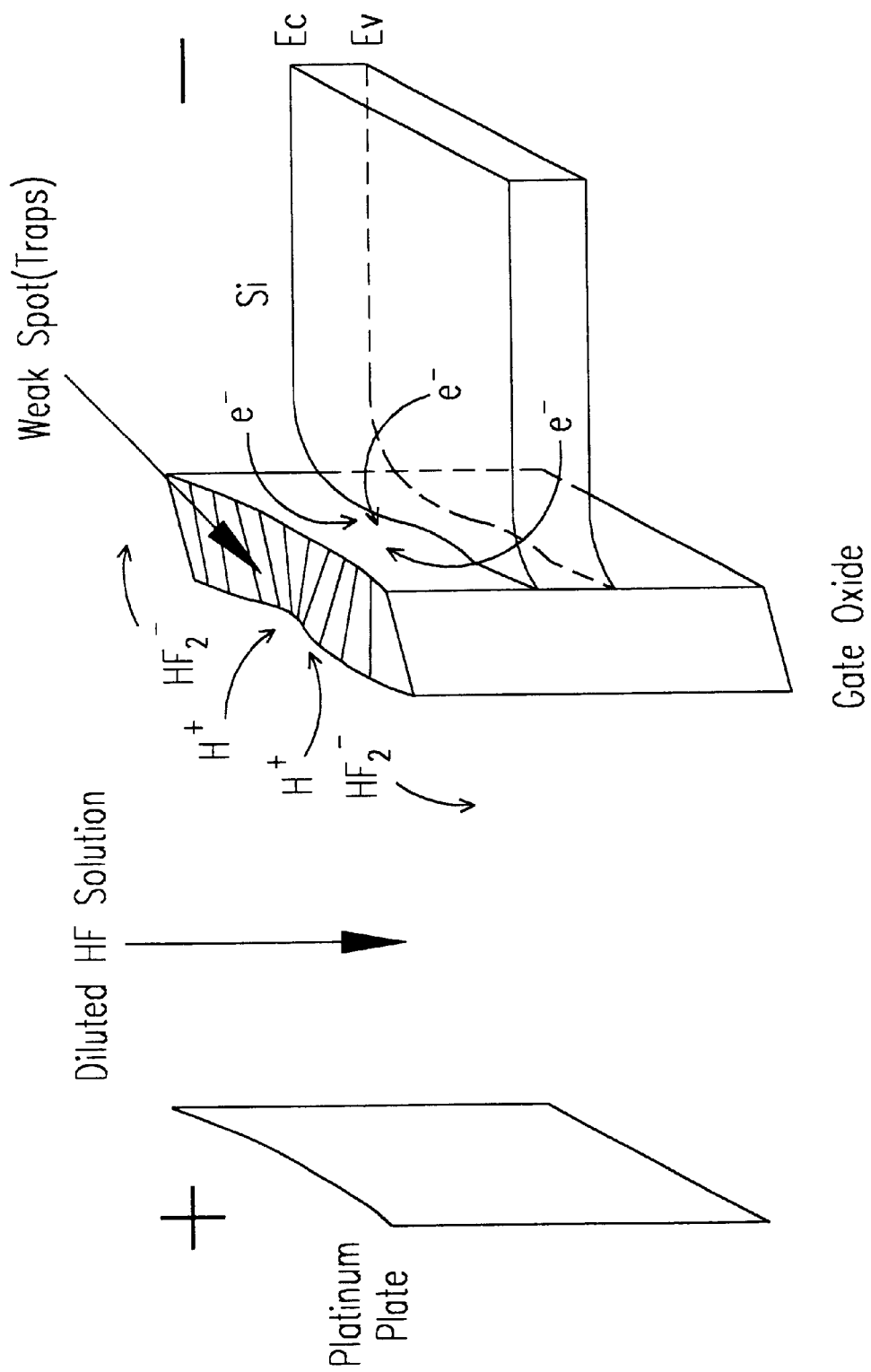
FIG. 5 is a schematic diagram showing the energy level of the gate oxide according to the present invention.

Please refer to FIG. 5 illustrating the condition of the gate oxide stressed by the electrons.

According to the above statements, the present invention utilizes a chemical solution with high electrical conductivity and a current source to induce an electron current to flow through a gate oxide formed on a silicon wafer. These electrons will stress the region with worse quality on the gate oxide or the region having unsaturated or incomplete bonds and the rapid thermal annealing (RTA) is performed to rebind the regions where have been stressed by electrons. Therefore, the gate oxide formed by this method will not only raise the stability, but can suffer higher breakdown electric field and score higher charge-to-breakdown.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What we claim is:

1. A method for improving electrical properties of a gate oxide, comprising the steps of:

(a) providing a silicon wafer with a gate oxide formed thereon;
(b) providing a specific metal plate;
(c) immersing said silicon wafer and said specific metal plate in a chemical solution;
(d) respectively connecting said silicon wafer and said specific metal plate with a current source and inducing an electron current to flow from said current source through said gate oxide of said silicon wafer to said specific metal plate;
(e) removing said silicon wafer from said chemical solution and removing the residual chemical solution from the surface of said gate oxide; and
(f) treating said gate oxide with an annealing process.

2. The method according to claim 1, wherein before said step (a), said method further includes a step of cleaning the surface of said silicon wafer.

3. The method according to claim 2, wherein said silicon wafer is cleaned by the Radio Corporation of America (RCA) clean process.

4. The method according to claim 1, wherein said gate oxide is formed by a thermal oxidation.

5. The method according to claim 4, wherein said thermal oxidation is a rapid thermal oxidation (RTO).

6. The method according to claim 1, wherein said gate oxide is made of silicon oxide ($SiO_2$).

7. The method according to claim 1, wherein said gate oxide is made of silicon nitride ($Si_3N_4$).

8. The method according to claim 1, wherein said gate oxide is made of tantalum oxide ($Ta_2O_5$).

9. The method according to claim 1, wherein said specific metal plate is a platinum plate.

10. The method according to claim 9, wherein said platinum plate is electrically connected to the positive terminal of said current source to serve as an anode.

11. The method according to claim 10, wherein said silicon wafer is electrically connected to the negative terminal of said current source to serve as a cathode.

12. The method according to claim 1, wherein said chemical solution has a relatively high electrical conductivity.

13. The method according to claim 12, wherein said chemical solution is a diluted hydrofluoric acid (HF).

14. The method according to claim 13, wherein said diluted hydrofluoric acid has a concentration ranged from 0.049% to 0.98%.

15. The method according to claim 14, wherein said diluted hydrofluoric acid has a concentration of 0.245%.

16. The method according to claim 1, wherein said electron current has a current density ranged from 0.1 $\mu A/cm^2$ to 10 $\mu A/cm^2$.

17. The method according to claim 16, wherein said electron current has a current density of 4 $\mu A/cm^2$.

18. The method according to claim 1, wherein in said step (e), said chemical solution remained on the surface of said gate oxide is removed by the deionized water.

19. The method according to claim 1, wherein said annealing process is a rapid thermal annealing (RTA) process.

20. A method for densifying a thin gate oxide formed on a silicon wafer, comprising the steps of:
(a) providing a specific metal plate;
(b) immersing said silicon wafer and said specific metal plate in a chemical solution;
(c) respectively connecting said silicon wafer and said specific metal plate with a current source and inducing an electron current to flow from said current source through said gate oxide of said silicon wafer to said specific metal plate;
(d) removing said silicon wafer from said chemical solution and removing the residual chemical solution from the surface of said gate oxide; and
(e) treating said gate oxide with an annealing process.

21. A method for improving electrical properties of a thin gate oxide formed on a silicon wafer, comprising:
(a) providing a specific metal plate;
(b) immersing said silicon wafer and said specific metal plate in a chemical solution containing an diluted hydrofluoric acid;
(c) respectively connecting said silicon wafer and said specific metal plate with a current source, wherein said silicon wafer serves as a cathode and said specific metal plate serves as an anode;
(d) inducing an electron current to flow from said current source to said gate oxide of said silicon wafer;
(e) removing said silicon wafer from said chemical solution and removing the residual chemical solution from the surface of said gate oxide; and
(f) treating said gate oxide with an annealing process.

* * * * *